United States Patent [19]
Maciel

[11] Patent Number: 5,969,626
[45] Date of Patent: Oct. 19, 1999

[54] ESD GROUND MONITOR FOR ELECTROSTATIC SAFE WORK TABLES

[75] Inventor: Joe Maciel, Santa Clara, Calif.

[73] Assignee: Altera Corporation, San Jose, Calif.

[21] Appl. No.: 08/947,079

[22] Filed: Oct. 8, 1997

Related U.S. Application Data

[60] Provisional application No. 60/028,458, Oct. 9, 1996.
[51] Int. Cl.⁶ .................................................... G08B 21/00
[52] U.S. Cl. ......................... 340/649; 340/652; 361/212; 324/510
[58] Field of Search .................................... 340/649, 650, 340/652, 532; 361/212, 220; 324/509, 510

[56] References Cited

U.S. PATENT DOCUMENTS

| | | | |
|---|---|---|---|
| 5,051,732 | 9/1991 | Robitaille | 340/650 |
| 5,083,117 | 1/1992 | Hoigaard | 340/649 |
| 5,317,476 | 5/1994 | Wallace et al. | 361/220 |
| 5,422,630 | 6/1995 | Quinn et al. | 340/661 |

*Primary Examiner*—Jeffrey A. Hofsass
*Assistant Examiner*—Sihong Huang
*Attorney, Agent, or Firm*—Townsend and Townsend and Crew LLP

[57] ABSTRACT

A device and method for monitoring the integrity of a ground connection between an electrostatic apparatus and earth ground. The device and method provide for continuous monitoring of the connection. The device includes an audible and visual alarm if there is a fault in the grounding connection. It also provides an audible and visual alarm if a DC power supply falls below a specified value. A switch is provided for testing the circuit manually to ensure its proper operation.

14 Claims, 6 Drawing Sheets

ESD GROUND MONITOR FOR ELECTROSTATIC SAFE WORK TABLES

CROSS-REFERENCE TO RELATED APPLICATIONS

This application claims the benefit of Provisional Application Ser. No. 60/028,458 filed Oct. 9, 1996, which is incorporated herein by reference for all purposes.

BACKGROUND OF THE INVENTION

The present invention relates to integrated circuit manufacturing. More specifically, the present invention relates to a device for detecting whether an apparatus, such as one used in manufacturing and development environments, is grounded sufficiently.

Due to the sensitive nature of modern integrated circuits, care must be taken to ensure adequate grounding of equipment and work spaces used near these devices. Without adequate grounding, static electricity may build up and cause an electrostatic discharge (ESD) event. ESD events may cause damage to the integrated circuit. To prevent this static electricity build up, grounding cables are often provided to electrically couple apparatuses such as work benches, tables, people, tools, equipment, and other conductive objects to earth ground. These grounding cables provide a conductive path to earth ground so as to shunt any static electricity to earth ground before it can build up.

Problems may occur with the grounding cables in many manufacturing and design environments. The grounding cables may be accidentally or intentionally disconnected. With the grounding cable disconnected, the equipment is no longer adequately grounded. If the disconnected ground cable goes undetected, integrated circuits may become damaged by an ESD event. Consequently, disconnected grounding cables may have negative effects on quality control in a manufacturing environment.

A variety of monitoring devices are presently on the market which can detect whether a particular apparatus is properly grounded. However, presently available devices have limitations. For example, one such device operates from an AC power source and requires the user to manually perform a series of tests to verify the grounding integrity of the apparatus. Such a system requires the user to follow correct procedures to ensure a proper grounding. If the tests are not completed, the monitor does not indicate a fault in the grounding system. So, the monitor is only as good as the people executing the procedures. Furthermore, no indication is given of a grounding cable that becomes disconnected between the performance of the tests. Consequently, the integrated circuits may be damaged in the time between the disconnection of the cable and the subsequent performance of the test.

Additionally, the use of AC power can cause problems in manufacturing or design environments. For example an AC power source must be conveniently available, the power source may accidentally be unplugged, the power supply may fail, or electromagnetic interference may be generated which effects the monitoring circuit. If the power supply is disconnected so the monitor no longer operates properly, currently available devices do not give an indication that a problem exists. So the user may not detect grounding problems even after following the testing procedures.

Consequently, an improved device for monitoring the integrity of ground connection is desirable.

SUMMARY OF THE INVENTION

The present invention solves the problems associated with the prior art. It provides a device and a method of monitoring the integrity of a connection between an apparatus and earth ground. The device is a more robust, low level voltage, DC powered, ground monitor. It continuously monitors the voltage level of the apparatus against a reference voltage and enables an alarm if the apparatus voltage level crosses outside the reference voltage. The alarm may be audible, visual, or both.

In an embodiment of the present invention, an upper and lower reference voltage are provided and the alarm is enabled if the apparatus voltage level goes outside these levels. A user of the device may adjust the reference voltages to desired values. In operation, the apparatus voltage may go outside the reference voltages, for example, when a grounding cable does not meet specification, or when the grounding cable is disconnected from the apparatus.

The present invention further monitors the voltage level of a DC power supply that provides power to the device. The device continuously monitors the DC voltage level and if it drops below a specified voltage level, an audible alarm, visible alarm, or both are enabled. The alarm provided when the dc voltage drops below the specified voltage level may be a different alarm than that provided by the device when the ground cable is disconnected. This gives an indication to the user that the power to the system has been interrupted and the device may not operate correctly. This is useful to determine, for example, when a battery should be replaced.

A further understanding of the nature and advantages of the inventions herein may be realized by reference to the remaining portions of the specification and the attached drawings.

DESCRIPTIONS OF THE PREFERRED EMBODIMENTS

Figure 1B:
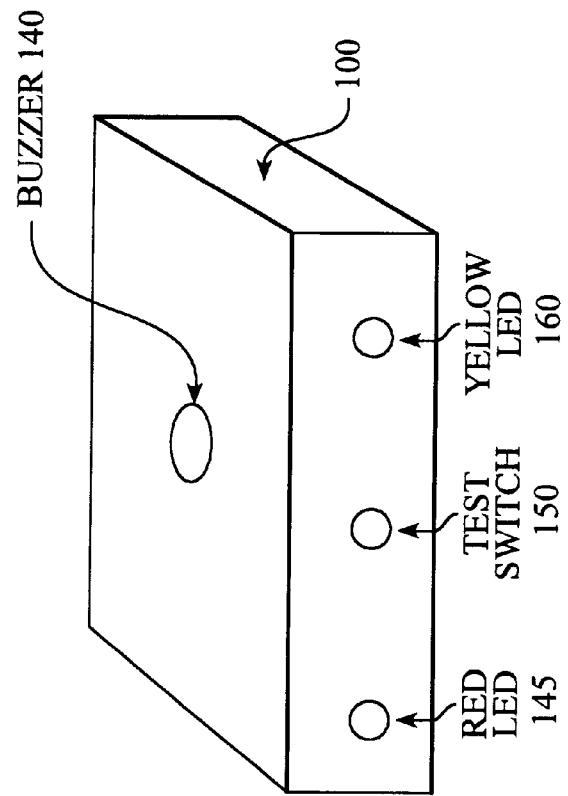
FIG. 1B shows a front view of the EGM.
Figure 1A:
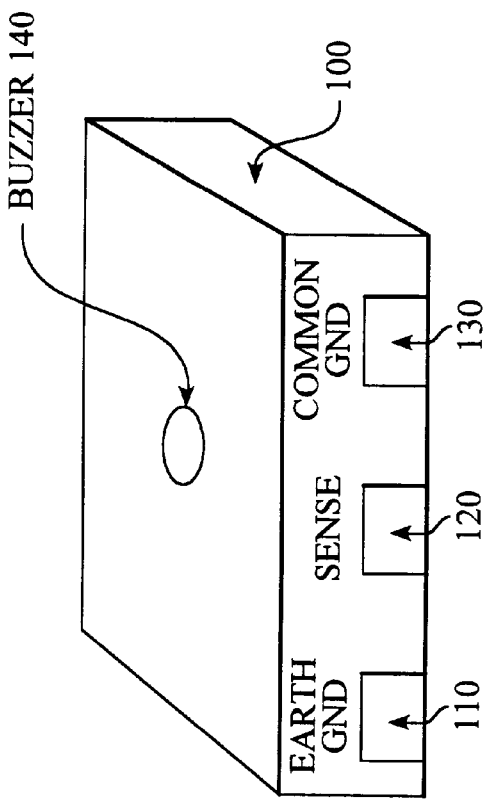
FIG. 1A shows a rear view of an Electrostatic Device Ground Monitor (EGM)

FIGS. 1A and 1B set forth rear and front views of a possible physical implementation of an Electrostatic Device Ground Monitor (EGM) 100. Of course, other physical implementations in accordance with the principles described herein are also possible. For example, the elements may all be on the front of EGM 100, or in the rear of EGM 100, or any other configurations, without departing from the spirit and scope of the present invention.

Referring to FIG. 1A, EGM 100 provides an earth ground connector 110, a sense connector 120, and a common ground connector 130. Connectors 110, 120, and 130 may be any convenient connector for coupling wires or other conductors to EGM 100. Earth ground connector 110 provides a terminal for coupling EGM 100 to earth ground via a grounding pipe or some other grounding strip. Sense connector 120 provides a terminal for connecting EGM 100 to an apparatus. Common ground connector 130 provides a terminal for daisy-chaining one EGM to another as will be described below with reference to FIG. 3.

Referring to FIG. 1B, EGM 100 provides a buzzer 140, a red light emitting diode (LED) 145, a test switch 150, and a yellow LED 160. In the preferred embodiment, red LED 145 provides a visual alarm when EGM 100 detects a fault in the ground connection between earth ground and the apparatus coupled to sense connector 120. Test switch 150 is a normally-closed push button which, when pressed, simulates a disconnected grounding cable and causes a fault to be detected by EGM 100. Yellow LED 160 provides a visual alarm when EGM 100 detects a low DC voltage supply. Buzzer 140 provides an audible alarm when either red LED 145 or yellow LED 160 is activated. Of course, other types of audible and visual alarms may be substituted for those described. For example, different colored LEDs may be used, or the alarms may be limited to visual only or audible only types of alarms, if so desired. Alternatively, red LED 145 and yellow LED 160 may be replaced by a single visual alarm.

With EGM 100 properly connected, a programmable logic device (PLD) may be manufactured and tested on a monitored apparatus such as a workbench, table, person, tool, equipment, or other conductive device or object without concern that an electrostatic charge will destroy the device. If an electrostatic charge were created, it would be shunted to earth ground before it could build up enough to cause an ESD event. EGM 100 monitors the ground connection to ensure there is a path established from the apparatus to earth ground.

Figure 2:
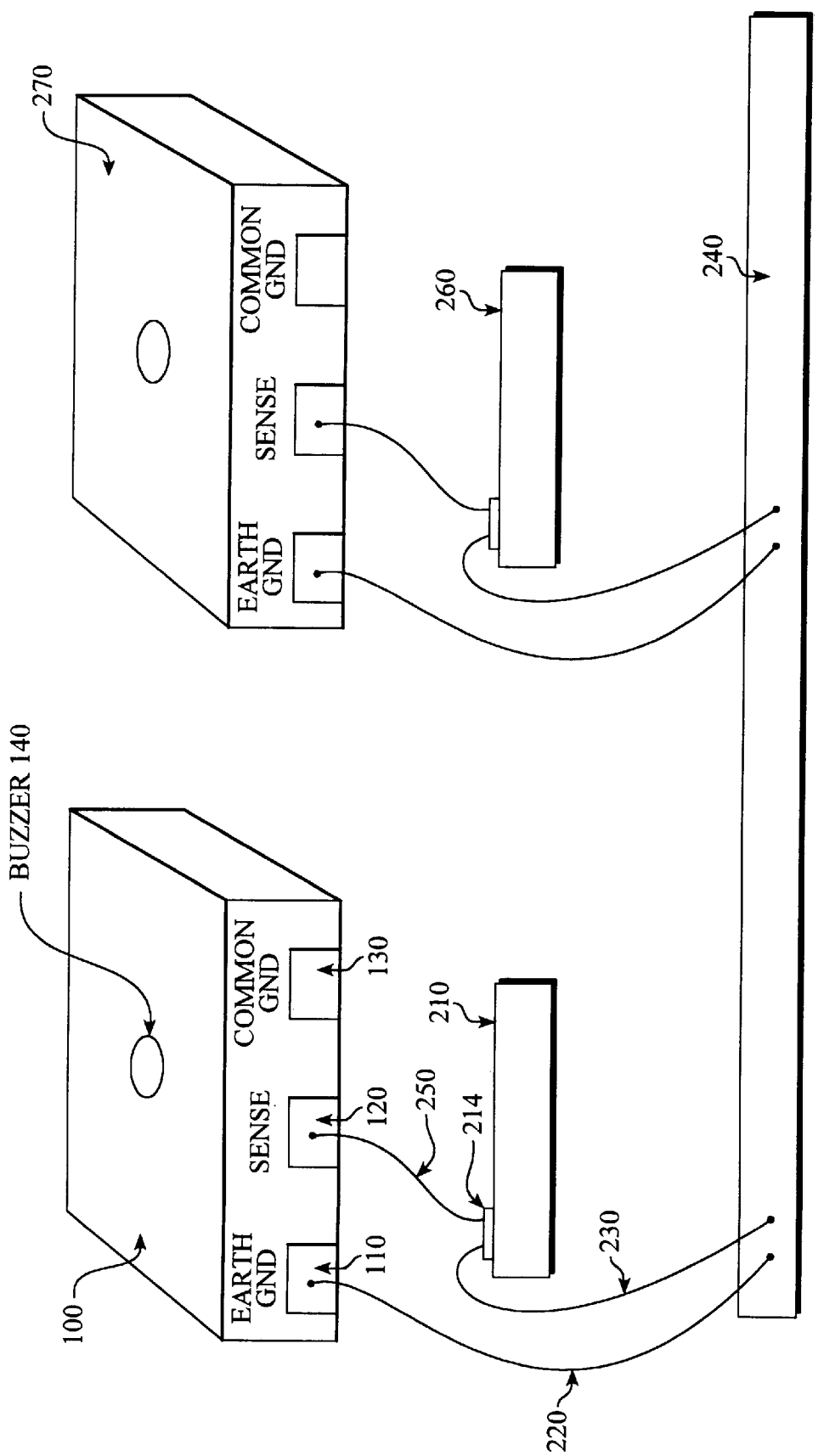
FIG. 2 illustrates the EGM in a standard configuration connection.

FIG. 2 sets forth a standard configuration for wiring EGMs 100 and 270 to apparatuses 210 and 260, respectively. This configuration may be especially appropriate, for example, when EGM 100 (with its apparatus 210) is located far away from EGM 270 (with its apparatus 260). Additional EGMs and apparatuses may be similarly configured.

Apparatus 210 has an apparatus connector 214 for providing grounding connections. Any suitable connector may be used for apparatus connector 214. A grounding cable 230 connects with apparatus connector 214 and couples apparatus 210 to an earth ground 240. This provides an earth ground for apparatus 210 to protect from electrostatic events. It is this connection that EGM 100 monitors. In other words, EGM 100 operates to protect the integrity of the coupling of apparatus 210 and earth ground 240 by way of grounding cable 230.

In the standard configuration, earth ground connector 110 connects to earth ground 240 by earth ground line 220. This grounds EGM 100 to earth ground. Ground sense cable 250 couples sense connector 120 to apparatus connector 214. This configuration provides a closed loop between apparatus 210, EGM 100, and earth ground 240. If one loop is broken, EGM 100 provides alarms as will be discussed below. EGM 270 may be similarly configured to monitor a second apparatus 260. Other EGMs and apparatuses may be added as necessary.

Figure 3:
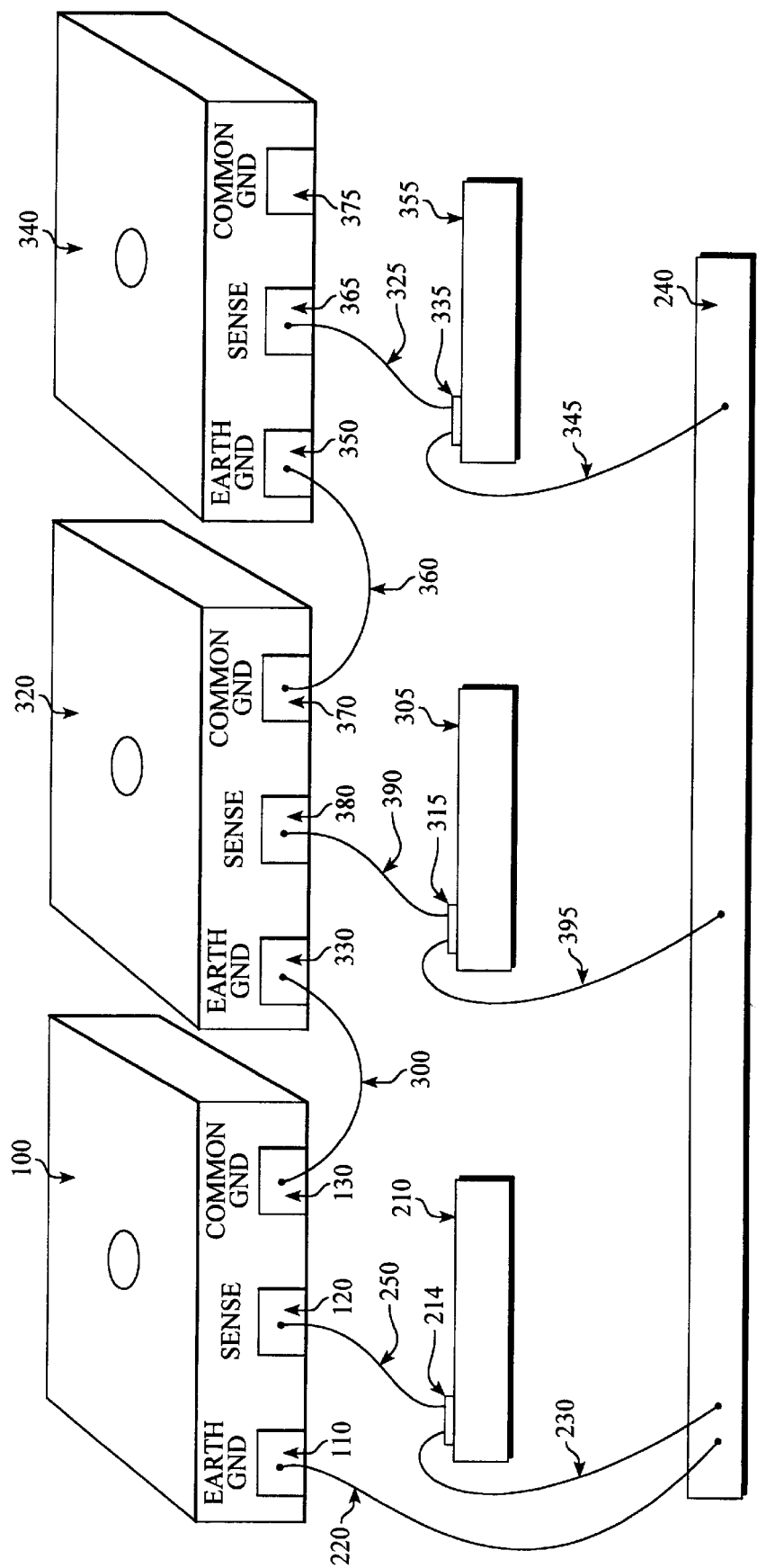
FIG. 3 illustrates several EGMs in a daisy chain configuration.

FIG. 3 illustrates a daisy-chain configuration as an alternative to the standard configuration shown in FIG. 2. This configuration may be appropriate, for example, when EGM 100 (with its apparatus 210) is located close to other EGMs 320 and 340 (with their apparatuses 305 and 355, respectively).

Apparatus 210 is coupled to earth ground 240 with ground cable 230. Sense connector 120 of EGM 100, as with the standard configuration of FIG. 2, senses the ground connection of apparatus 210 to earth ground connector 240 with ground cable 250. EGMs 320 and 340 may also be similarly connected. EGM 100 is also connected to earth ground connector 240 through earth ground connector 110 using ground cable 220. However, in the daisy chain configuration, EGM 320 connects its earth ground connector 330 to common ground connector 130 of EGM 100 by connector cable 300. If another EGM 340 was used in this configuration, common ground connector 370 on EGM 320 would be connected to earth ground connector 350 on EGM 340 via ground cable 360. If connector cable 300 became disconnected, EGM 320 would sense the disconnect and audible and visual alarms would be activated.

Multiple EGMs 100 may also be connected in other configurations. For example, the configurations may be mixed with some devices connected according to the standard configuration and others connected according to the daisy-chain configuration.

Figure 4:
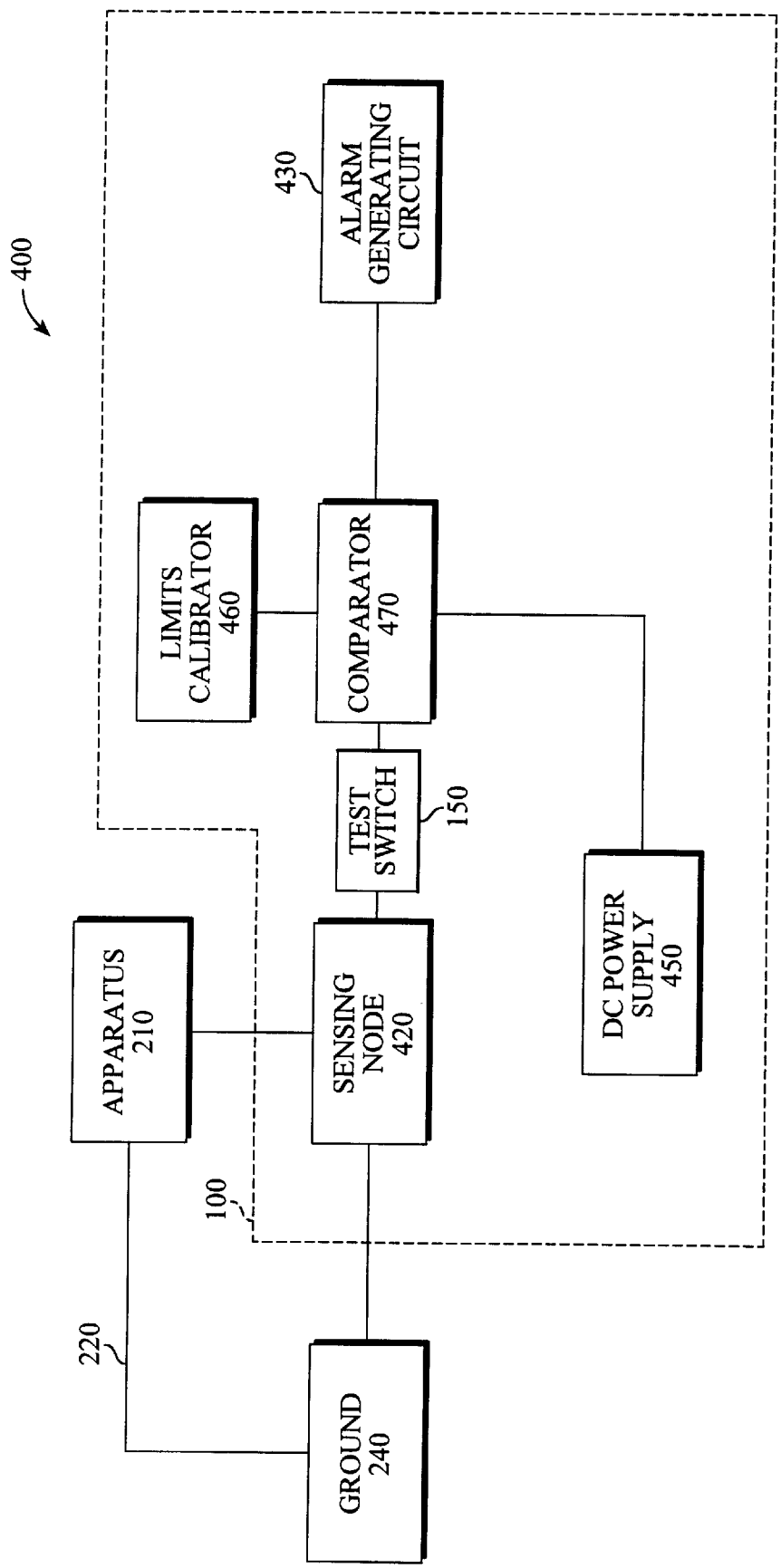
FIG. 4 is a block diagram of the present invention.

FIG. 4 is a block diagram of a ground monitoring system 400 of the present invention. It includes EGM 100 which monitors the integrity of the connection of apparatus 210 to earth ground 240 by ground cable 220. EGM 100 comprises a sensing node 420, a comparator 470, a limits calibrator 460, a test switch 150, a DC power supply 450, and an alarm generation circuit 430. In operation, EGM 100 monitors apparatus 210 to ensure its connection to earth ground 240 is complete. If ground cable 220 between apparatus 210 and earth ground 240 becomes disconnected, sensing node 420 senses a voltage shift. Comparator 470 compares the voltage shift against values specified by limits calibrator 460. If the voltage shift crosses over the limits given by limits calibrator 460, alarm generation circuit 430 enables appropriate alarms as will be discussed further below.

DC power supply 450 is provided for supplying power to EGM 100. Although not shown in FIG. 4 for simplicity, DC power supply 450 connects throughout EGM 100 to provide a power source for the various elements. In the preferred embodiment, DC power supply 450 is a battery. This is advantageous because it allows EGM to be portable and requires no power outlet on a manufacturing floor.

Comparator 470 senses the voltage level of DC power supply 450 continuously. If the voltage level of DC power supply 450 drops below a certain level, comparator 470 detects this and enables alarm generation circuit 430. Details of a preferred embodiment for comparator 470 will be given below with respect to FIGS. 5 and 6.

Figure 5:
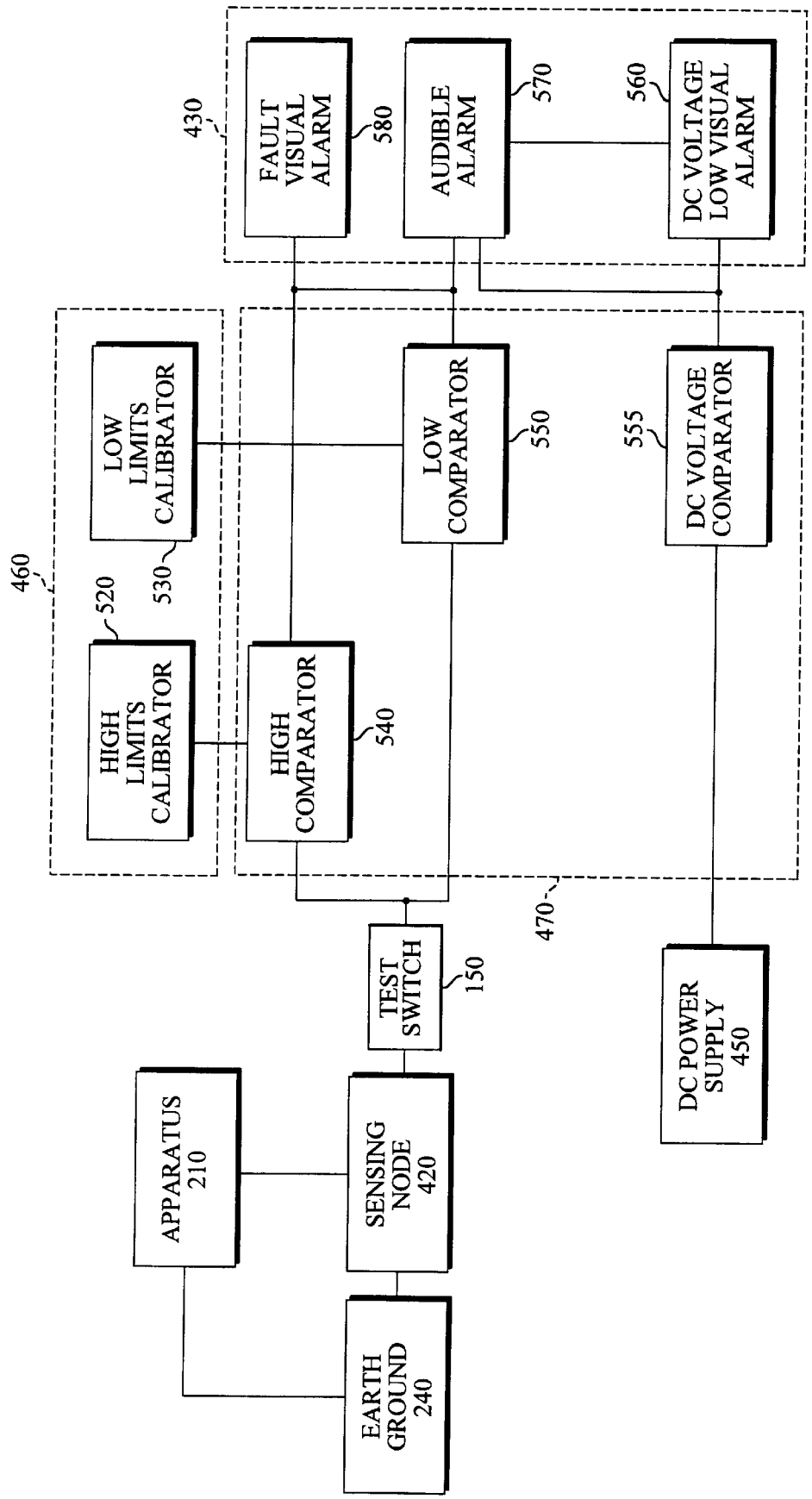
FIG. 5 is a more detailed block diagram of the present invention.

FIG. 5 is a more detailed block diagram of a preferred embodiment for ground monitoring system 400 shown in FIG. 4, above. Limit calibrator 460 is comprised of high limit calibrator 520 and low limit calibrator 530. They each output a voltage that specifies the upper and lower limits, respectively, that the voltage on sensing node 420 may achieve without enabling alarm generation circuit 430.

In the preferred embodiment, comparator 470 is comprised of three individual comparator circuits. Two of the comparator circuits, high limit comparator 540 and low limit comparator 550 compare the voltage on sensing node 420 against the voltage on high limit calibrator 520 and the voltage on low limit calibrator 530, respectively. If the voltage on sensing node 420 increases above the voltage on high limit calibrator 520, alarm generation circuit 430 is activated. Similarly, alarm generation circuit 430 is activated if the voltage on sensing node 420 falls below the voltage on low limit calibrator 530.

In its operation several situation may cause the voltage on sensing node 420 to fall outside the limits set by high and low limits calibrators 520 and 530. For example, an open circuit between monitored apparatus 210 and ground 240, or an open circuit in the between sense connector 120 and the apparatus, or earth ground connector 110 and earth ground source 240. A cable which falls outside its specified maximum impedance values (i.e., 1,000,000 Ohms+/−5%) may cause the same effect as an open circuit. These faults may be simulated by opening test switch 150.

A third comparator in comparator 470 is DC voltage comparator 555. If the voltage level of DC power supply 450 falls below a specified limit, then this DC voltage comparator 555 recognizes this and activates alarm generation circuit 430.

Alarm generation circuit 430 may include more than one alarm. For example, in the preferred embodiment, a DC voltage low visual alarm 560, an audible alarm 570, and a fault visual alarm 580 are provided. If an fault occurs such that the voltage on sensing node 420 goes outside the high or low voltage limits set by high and low limits calibrators 520 and 530, audible alarm 570 and fault visual alarm 580 are enabled. In the preferred embodiment, audible alarm 570 activates buzzer 140. Fault visual alarm 580 activates red LED 145. If, for any reason, the voltage from DC power supply 450 voltage decreases below the specified limit, audible alarm 570 and DC voltage low alarm 560 are enabled. In the preferred embodiment DC voltage low alarm 560 activates yellow LED 160. By providing different colored LED for visual alarms 560 and 580, the specific problem to be easily identified.

Figure 6:
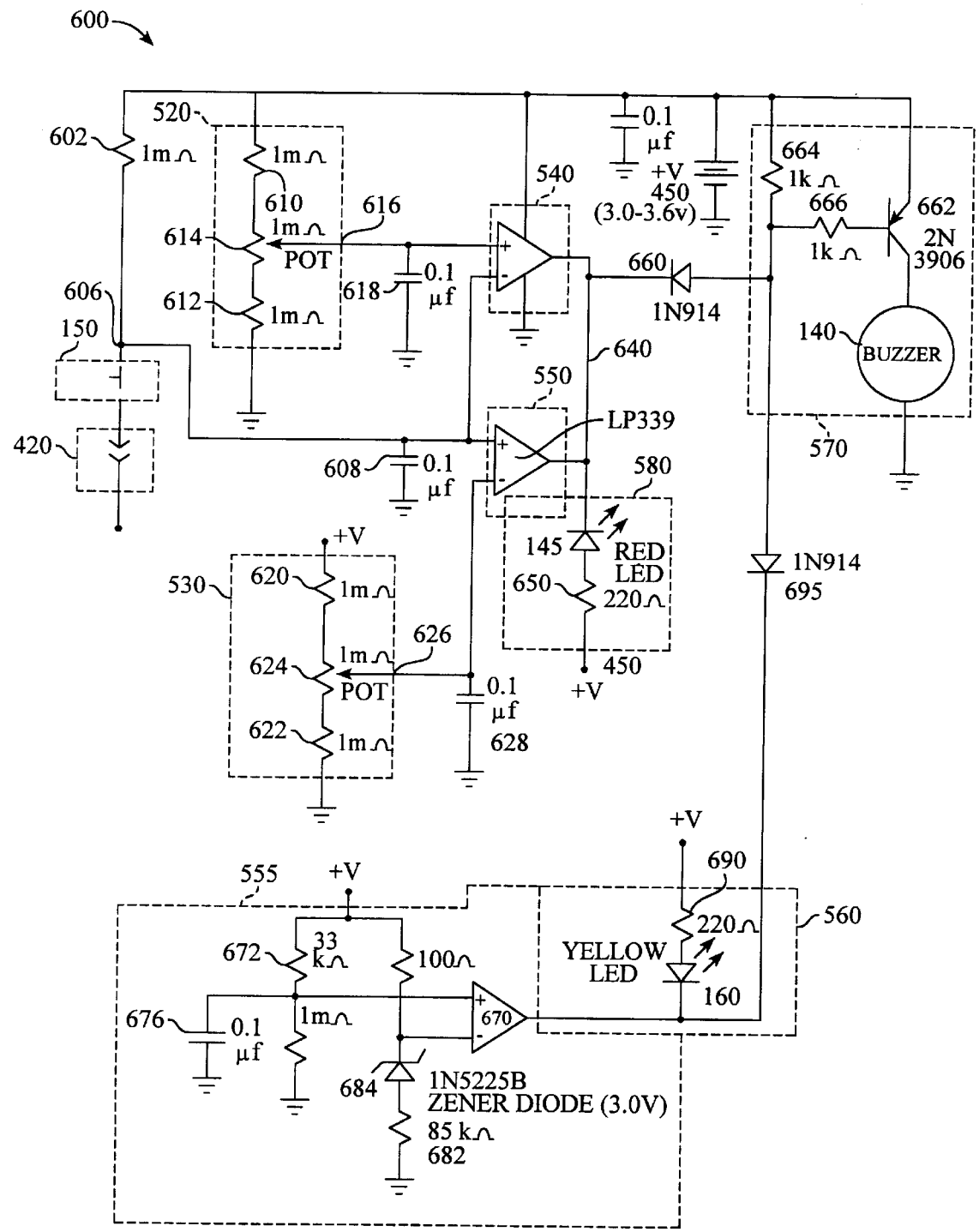
FIG. 6 is a schematic diagram of circuitry that may be used to implement an EGM of the present invention.

FIG. 6 is a schematic diagram of a circuit 600 that may be used for to implement EGM 100. DC power supply 450 provides DC power to EGM circuit 600. In the preferred embodiment, DC power supply 450 is a 3.0–3.6 volt battery appropriate for use with conventional integrated circuit devices.

A sensing node 420 couples EGM circuit 600 to sense connector 120 of EGM 100. A resistor 602 lies between sensing node 420 and DC power supply 450. In effect, this creates a voltage divider at a node 606 between resistor 602 and an impedance seen from node 606 toward sensing node 420. In other words, the voltage at node 606 will be given by the equation V(R1/(R1+R2)), where V is the voltage of DC power supply 450, R1 is the resistance of resistor 602, and R2 is the impedance looking back toward sensing node 420. Consequently, if the impedance looking toward sensing node 420 is significantly larger than resistor 602 (i.e., an open circuit,) then the voltage at node 606 will be essentially equal to the voltage of DC power supply 450. A capacitor 608 is coupled on node 606 to smooth out spurious voltage spikes on node 606. Capacitor 608 is preferably a 0.1 microfarad capacitor A test switch 150 is provided to electrically break the connection between a node 606 and sense node 420 for testing purposes. Test switch 150 is a normally-closed push button. When test switch 150 is closed, node 606 is electrically coupled to node 420. When test switch 150 is open, then sensing node 420 appears to be an open circuit.

In operation, the voltage at node 606 is sensed by high and low comparators 540 and 550 where it is compared against voltage output from high and low limit calibrators 520 and 530, respectively.

High limit calibrator 520 comprises a voltage divider made up of resistors 610, resistor 612, and variable resistor 614. Resistor 610 is coupled to DC power supply 450 and to variable resistor 614. Variable resistor 614 is, in turn, coupled to resistor 612 which is coupled to ground. The output of variable resistor 614 is taken as output 616 of high limit calibrator 520. By adjusting variable resistor 614, output 616 may be adjusted to the desired high limit. In the preferred embodiment, resistors 610 and 612 are one megaohm resistors and variable resistor 614 is a one megaohm potentiometer. A capacitor 618 is coupled on output 616 to smooth out spurious voltage spikes on output 616. Capacitor 618 is preferably a 0.1 microfarad capacitor.

Similarly low limit calibrator 530 comprises a voltage divider made up of resistor 620, 622, and variable resistor 624. These are arranged similarly to resistors 610, 612, and variable resistor 614 to provide an output 626 from low limit calibrator 530. A capacitor 628 is coupled on output 626 to smooth out spurious voltage spikes on output 626. Capacitor 618 is preferably a 0.1 microfarad capacitor High comparator 540 is comprised of an operational amplifiers with a positive input, a negative input, and an output. The positive input is coupled with output 616. The negative input is coupled with node 606. The output is coupled to node 640. In operation, as long as the voltage on node 606 is less than the voltage on node 616, then high comparator 520 outputs a logical high value to node 640. If the voltage on node 606 goes above the voltage on output 616, then high comparator 540 drives node 640 to a logical low level.

Low comparators 550 is also comprised of an operational amplifiers with a positive input, a negative input, and an output. The positive input is coupled with node 606. The negative input is coupled with output 626. The output is coupled to node 640. In operation, as long as the voltage on node 606 is greater than the voltage on node 616, then low comparator 520 outputs a logical high value to node 640. If the voltage on node 606 goes below the voltage on output 626, then low comparator 550 drives node 640 to a logical low level.

In normal operation variable resistors 614 and 624 are set such that when no fault has occurred in the system, node 606 is between the voltages supplied on outputs 616 and 626 by low limit calibrator 530 and high limit calibrator 520. Consequently, neither comparator 540 or 550 drives node 640 low unless a fault has occurred.

Node 640 is also coupled to fault visual alarm 580. In the preferred embodiment, fault visual alarm is comprised of red LED 145 and a resistor 650 coupled in series to DC power supply 450. When node 640 is at a logical high level, no current flows through red LED 145, so red LED 145 is off. However, if either high comparator 540 or low comparator 550 drive node 640 to a logical low level, then current flows through red LED 145, turning it on. In the preferred embodiment, resistor 650 is a 220 ohm resistor.

Node 640 is also coupled to audible alarm 570 through diode 660. Audible alarm 570 comprises buzzer 140 coupled between the drain of a transistor 662 and ground. The source of transistor 662 is coupled to DC power supply 450. The gate of transistor 662 is coupled to diode 660 and resistors 664 and 666. When node 640 is at a high logic level, no current flows through diode 660. However when high comparator 540 or low comparator 550 drive node 640 low, then current flows through diode 660, which drives the gate of transistor 662 low turning it on and activating buzzer 140. Transistor 664 is preferably a commercially available 2N3906 transistor. Resistors 664 and 666 are conventional one kilohm resistors, while diode 660 is preferably a commercially available 1N914 diode.

In operation, sensing node 420 may appear as a very high impedance or a very low impedance. Either case may signal a possible problem with the integrity of the grounding of apparatus 210.

If the impedance is very high, then the voltage at node 606 will increase. As a result, the voltage on the positive input of low comparator 550 will further increase above the negative input voltage 626 which will result in low comparator 550 outputting a logical high on node 640. However, voltage 606 is also sensed by high comparator 540 at its negative input. As voltage 606 increases, the voltage on the negative input of high comparator 540 increases. When voltage 606 increases above the positive input voltage 616, high comparator 540 drives node 640 low. Due to the low output from high comparator 540, current flows through fault visual alarm 580 activating red LED 580. Diode 660 also allows current to flow activating buzzer 140.

Similarly, when the impedance is very low (such as a short circuit,), the voltage at node 606 decreases to zero. As a result, the positive input of low comparator 550 will decrease to a level below output 626 which will produce a low at node 640. As in the previous case, fault visual alarm 580 turns on red LED 145, and diode 660 allows conduction causing buzzer 140 to activate.

The remaining portion of EGM circuit 600 detects a condition when the voltage on DC power supply 450 drops below a specified value. DC voltage comparator 555 includes an operational amplifier 670. In the preferred embodiment, operational amplifier 670 is on the above mentioned LP339 integrated circuit. The positive input of operational amplifier 670 is connected to a voltage divider network coupled between DC power supply voltage and ground. The voltage divider networks comprises a resistor 672 and a resistor 674. In the preferred embodiment, resistor 672 is a 33 kilohm resistor and resistor 674 is a one megaohm resistor. This combination sets the voltage level at the positive input to the operational amplifier at two-thirds of the voltage of DC power supply 450. A capacitor 676, preferably 0.1 microfarads, is placed on the positive input to operational amplifier 670 to remove spurious voltage spikes.

The negative input to operational amplifier 670 is coupled between another voltage divider network comprising a resistor 680, a resistor 682, and a Zener diode 684. Resistor 680 is coupled between DC power supply 450 and the negative input. The series connected Zener diode 684 and resistor 682 are coupled between the negative input and ground. Resistor 680 is preferably 100 kilohms, resistor 682 is preferably 85 Kilohms, and Zener diode 684 is a commercially available 1N5225B Zener diode.

When the voltage of DC power supply 450 is normal (i.e., 3.0–3.6 volts in the preferred embodiment,) the output of operational amplifier 860 is high. However, if the battery voltage 450 is below normal, the voltage at the positive input drops below the voltage at the negative input of operational amplifier 670. This causes operational amplifier 670 to output a logical low level.

DC voltage low visual alarm 560 is coupled to the output of operational amplifier 670. It comprises a resistor 690, preferably 220 ohms and yellow LED 160, coupled in series between DC power supply 670 and the output of operational amplifier 670. When the output of operational amplifier 670 is high, no current is conducted through yellow LED 160 so it off. However, when the output of operational amplifier 670 is low, then current flows and yellow LED 160 is illuminated.

Audible alarm 570 is coupled to the output of operational amplifier 670 through a diode 695. Diode 695 is preferably a commercially available 1N914 diode. It operates similarly to diode 660, and it turns audible alarm 570 on when the output of operation amplifier 670 is low.

It should be understood that the values used and explained herein are typical values and that they may be varied over a large range. Additionally, it should be understood that any component used may be substituted with its equal without affecting the operation of the EGM. The foregoing description is intended as examples of preferred embodiments for the present invention. However, other embodiments may be readily envisioned that do not depart from the spirit and scope of the present invention. These examples are not intended to limit the present invention. The invention is to be limited only by the metes and bounds of the attached claims.

What is claimed is:

1. A device for monitoring the integrity of a connection between an apparatus and an earth ground source comprising:

a dc voltage supply for supplying power to the device;

a node coupled to the connection, the node having a voltage level based on the impedance of the connection;

a first reference voltage circuit for providing a first reference voltage;

a second reference voltage circuit for providing a second reference voltage;

a first comparator circuit coupled to the node and the first reference voltage circuit;

a second comparator circuit coupled to the node and the second reference voltage circuit;

a third comparator circuit including:

a first input coupled to a ground source through a first resistor and to the dc voltage supply through a second resistor; and a second input coupled to the ground source through a Zener diode and a third resistor and to the dc voltage supply through a fourth resistor; and an alarm generating device coupled to the first, second and third comparator circuits providing an alarm (1) when the voltage level of the node is higher than the first reference voltage, (2) when the voltage level of the node is lower than the second reference voltage, and (3) when the voltage on the first input of the third comparator is lower than the voltage on the second input of the third comparator.

2. The monitoring device of claim 1, wherein the first reference voltage circuit comprises a potentiometer for adjusting the first reference voltage.

3. The monitoring device of claim 2, wherein the second reference voltage circuit includes a potentiometer for adjusting the second reference voltage.

4. The monitoring device of claim 1, wherein the first comparator circuit is a two input comparator comprising:

a first input being coupled to the first reference voltage circuit;

a second input being coupled to the node; and an output that enables the alarm generating device when a voltage on the first input is lower than a voltage on the second input.

5. The monitoring device of claim 1, wherein the dc power supply is a battery.

6. The monitoring device of claim 1, wherein the alarm generating device includes a visual alarm.

7. The monitoring device of claim 1, wherein the alarm generating device includes an audible alarm.

8. The monitoring device of claim 1, wherein the second comparator circuit is a 2-input comparator comprising:

a first input coupled to the node;

a second input coupled to the second reference voltage circuit;

an output that enables the alarm generating device when a voltage on the first input is lower than a voltage on the second input.

9. The monitoring device of claim 1, wherein the alarm generating device provides a single alarm that can be enabled by any of the first, second, and third comparator circuits.

10. The device of claim 1, wherein the alarm generating device further comprises first and second visual alarms, the first visual alarm being enabled by the first comparator circuit and the second visual alarm being enabled by the third comparator circuit.

11. A monitoring device for monitoring the integrity of a connection between an apparatus and an earth ground source comprising:

a dc voltage supply for supplying power to the device;

a node coupled to the connection, the node having a voltage level based on the impedance of the connection;

an alarm generating device;

first and second reference voltage circuits for providing first and second reference voltages;

a first comparator circuit for comparing the voltage level of the apparatus with the first reference voltage, the first comparator circuit including a first input being coupled to the first reference voltage circuit, a second input being coupled to the node, and an output that enables the alarm generating device when a voltage on the first input is lower than a voltage on the second input;

a second comparator circuit for comparing the voltage level of the apparatus with the second reference voltage, the second comparator circuit including a first input coupled to the node, a second input coupled to the second reference voltage circuit, and an output that enables the alarm generating device when a voltage on the first input is lower than a voltage on the second input;

a third comparator circuit including a first input coupled to a ground source through a first resistor and to the dc voltage supply through a second resistor, a second input coupled to the ground source through a Zener diode and a third resistor, and to the dc voltage supply through a fourth resistor, and an output for enabling the alarm generating device when a voltage on the first input is lower than a voltage on the second input.

12. The monitoring device of claim 11, wherein the first, second, and third comparator circuits are operational amplifiers.

13. The monitoring device of claim 12, wherein the first, second, and third comparator circuits are found on a single integrated circuit.

14. The monitoring device of claim 11, wherein the alarm generating device includes first and second visual alarms, and an audible alarm, the first visual alarm and the audible alarm being enabled by the first and second comparator circuits, and the second visual alarm being enabled by the third comparator circuit.

* * * * *